(12) United States Patent
Bhutta et al.

(10) Patent No.: US 10,454,453 B2
(45) Date of Patent: Oct. 22, 2019

(54) RF IMPEDANCE MATCHING NETWORK

(71) Applicant: Reno Technologies, Inc., Wilmington, DE (US)

(72) Inventors: Imran Ahmed Bhutta, Moorestown, NJ (US); Ching Ping Huang, Taipei (TW); Michael Gilliam Ulrich, Delanco, NJ (US); Tomislav Lozic, Gilbert, AZ (US)

(73) Assignee: RENO TECHNOLOGIES, INC., Wilmington, DE (US)

( * ) Notice: Subject to any disclaimer, the term of this patent is extended or adjusted under 35 U.S.C. 154(b) by 0 days.

(21) Appl. No.: 14/982,244

(22) Filed: Dec. 29, 2015

(65) Prior Publication Data

US 2016/0134260 A1  May 12, 2016

Related U.S. Application Data

(63) Continuation-in-part of application No. 14/935,859, filed on Nov. 9, 2015, which is a continuation-in-part of application No. 14/622,879, filed on Feb. 15, 2015, which is a continuation-in-part of application No. 14/616,884, filed on Feb. 9, 2015, which is a continuation-in-part of application No. 14/594,262, filed on Jan. 12, 2015, now Pat. No. 9,496,122.

(60) Provisional application No. 61/925,974, filed on Jan. 10, 2014, provisional application No. 61/940,139, filed on Feb. 14, 2014, provisional application No. 61/940,165, filed on Feb. 14, 2014, provisional application No. 62/077,753, filed on Nov. 10, 2014, (Continued)

(51) Int. Cl.
  *H03H 11/30* (2006.01)
  *H01J 37/32* (2006.01)

(52) U.S. Cl.
  CPC ....... *H03H 11/30* (2013.01); *H01J 37/32183* (2013.01); *H01J 37/32935* (2013.01)

(58) Field of Classification Search
  CPC ..................................... H03H 11/30
  USPC ..................................... 333/17.3
  See application file for complete search history.

(56) References Cited

U.S. PATENT DOCUMENTS

| 2003/0097984 A1* | 5/2003 | Nakano ............. H01J 37/32082 118/712 |
| 2006/0151591 A1* | 7/2006 | Matsuno .................. H03H 7/40 235/91 G |

(Continued)

*Primary Examiner* — Stephen E. Jones
*Assistant Examiner* — Samuel S Outten
(74) *Attorney, Agent, or Firm* — The Belles Group, P.C.

(57) ABSTRACT

A control circuit for a impedance matching circuit having first and second capacitor arrays receives as input one or more RF parameters of the impedance matching circuit, and in response thereto: determines a first match configuration for the first capacitor array and a second match configuration for the second capacitor array to create an impedance match between a fixed RF source impedance and a variable RF load impedance, the first match configuration and the second match configuration being determined from one or more look-up tables and based upon the detected one or more RF parameters; and alters at least one of the first array configuration and the second array configuration to the first match configuration and the second match configuration, respectively, by controlling the on and off states of (a) each discrete capacitor of the first capacitor array and (b) each discrete capacitor of the second capacitor array.

14 Claims, 13 Drawing Sheets

Related U.S. Application Data provisional application No. 62/097,498, filed on Dec. 29, 2014.

(56) References Cited

U.S. PATENT DOCUMENTS

| | | | |
|---|---|---|---|
| 2009/0174496 A1* | 7/2009 | Van Bezooijen | H03F 1/56 333/17.3 |
| 2012/0056689 A1* | 3/2012 | Spears | H03H 7/40 333/17.3 |

* cited by examiner

RF IMPEDANCE MATCHING NETWORK

CROSS REFERENCE TO RELATED APPLICATIONS

The present application is a continuation in part of U.S. patent application Ser. No. 14/935,859, filed Nov. 9, 2015, which is a continuation in part of U.S. patent application Ser. No. 14/622,879, filed Feb. 15, 2015, which is a continuation in part of U.S. patent application Ser. No. 14/616,884, filed Feb. 9, 2015, which is a continuation in part of U.S. patent application Ser. No. 14/594,262, filed Jan. 12, 2015, which in turn claims priority to U.S. Provisional Patent Application Ser. No. 61/925,974, filed Jan. 10, 2014. U.S. patent application Ser. No. 14/616,884, filed Feb. 9, 2015, also claims priority to U.S. Provisional Patent Application Ser. No. 61/940,139, filed Feb. 14, 2014. U.S. patent application Ser. No. 14/622,879, filed Feb. 15, 2015, also claims priority to U.S. Provisional Patent Application Ser. No. 61/940,165, filed Feb. 14, 2014. U.S. patent application Ser. No. 14/935,859, filed Nov. 9, 2015, also claims priority to U.S. Provisional Patent Application Ser. No. 62/077,753, filed Nov. 10, 2014. The present application also claims priority to U.S. Provisional Patent Application Ser. No. 62/097,498, filed Dec. 29, 2014. The disclosures of these references are incorporated herein by reference in their entireties.

BACKGROUND

The semiconductor device fabrication process uses plasma processing at different stages to make semiconductor devices, which may include a microprocessor, a memory chip, and other types integrated circuits and devices. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

The typical RF matching network includes variable capacitors and a control circuit with a microprocessor to control the capacitance values of the variable capacitors. Although several different configurations for RF matching networks are known, for simplicity, the remainder of the description will be in the context of one form of 'L' type RF matching network, with the understanding that one of skill in the art may apply the same principles to other types of RF matching networks.

RF matching networks that use capacitor arrays formed from a plurality of discrete capacitors are able to increase the switching speed of the matching network over the more traditional analogue variable capacitors. One example of a capacitor array that may be used in an RF matching network is described in U.S. Pat. No. 7,251,121, the disclosure of which is incorporated herein by reference in its entirety. With the increase in switching speed provided through the use of capacitor arrays, the bottleneck for achieving a faster switching speed is now often found in other parts of the RF matching network. One such bottleneck lies in the calculations that need to be done prior to switching.

BRIEF SUMMARY

The present disclosure is directed to circuits, methods, and systems for providing a variable capacitance in an impedance matching network. In particular, the circuits, methods, and systems disclosed aid in reducing the amount of time taken to switch between a first array configuration and a second array configuration for an impedance matching network which includes a plurality of capacitor arrays.

In one aspect, an RF impedance matching network includes: an RF input configured to be operatively coupled to an RF source, the RF source having a fixed RF source impedance; an RF output configured to be operatively coupled to an RF load, the RF load having a variable RF load impedance; an impedance matching circuit operatively coupled between the RF source and the RF output, the impedance matching circuit including: a first capacitor array including a first plurality of discrete capacitors and having a first array configuration which defines on and off states of the first plurality of discrete capacitors, the first capacitor array electrically coupled in series between the RF input and the RF output; and a second capacitor array including a second plurality of discrete capacitors and having a second array configuration which defines on and off states of the second plurality of discrete capacitors, the second capacitor array electrically coupled between a reference potential and one of the RF input and the RF output; an RF sensor operatively coupled to one of the RF input and the RF output, the RF sensor configured to detect one or more RF parameters of the impedance matching circuit; and a control circuit operatively coupled to the first capacitor array and the second capacitor array, wherein the control circuit is configured to: determine a first match configuration for the first capacitor array and a second match configuration for the second capacitor array to create an impedance match between the fixed RF source impedance and the variable RF load impedance, the first match configuration and the second match configuration being determined from one or more look-up tables and based upon the detected one or more RF parameters; and alter at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

In another aspect, an RF impedance matching network includes: an RF input configured to be operatively coupled to an RF source, the RF source having a fixed RF source impedance; an RF output configured to be operatively coupled to a plasma chamber, the plasma chamber having a variable plasma impedance; an impedance matching circuit operatively coupled between the RF source and the RF output, the impedance matching circuit including: a series electronically variable capacitor ("series EVC") including a first plurality of discrete capacitors and having a series array configuration which defines on and off states of the first plurality of discrete capacitors, the series EVC electrically coupled in series between the RF input and the RF output; and a shunt electronically variable capacitor ("shunt EVC") including a second plurality of discrete capacitors having a shunt array configuration which defines on and off states of the second plurality of discrete capacitors, the shunt EVC electrically coupled between a reference potential and one of the RF input and the RF output; an RF sensor operatively coupled to one of the RF input and the RF output, the RF sensor configured to detect one or more RF parameters of the impedance matching circuit; and a control circuit operatively coupled to the series EVC and the shunt EVC, wherein the control circuit is configured to: determine a series match configuration for the series EVC and a shunt match configuration for the shunt EVC to create an impedance match between the fixed RF source impedance and the variable plasma impedance, the series match configuration and the shunt match configuration being determined from one or more look-up tables and based upon the detected one or more RF parameters; and alter at least one of the series array configuration and the shunt array configuration to the series match configuration and the shunt match configuration, respectively, by controlling the on and off states of (a) each discrete capacitor of the first plurality of discrete capacitors and (b) each discrete capacitor of the second plurality of discrete capacitors.

In yet another aspect, a method of impedance matching including: coupling an impedance matching circuit between an RF source and an RF load, the RF source having a fixed RF source impedance, the RF load having a variable RF load impedance, and the impedance matching circuit including: a first capacitor array including a first plurality of discrete capacitors and having a first array configuration which defines on and off states of the first plurality of discrete capacitors, the first capacitor array electrically coupled in series between the RF input and the RF output; and a second capacitor array including a second plurality of discrete capacitors and having a second array configuration which defines on and off states of the second plurality of discrete capacitors, the second capacitor array electrically coupled between a reference potential and one of the RF input and the RF output; detecting one or more RF parameters of the impedance matching circuit at one of an RF input of the impedance matching circuit or an RF output of the impedance matching circuit; determining a first match configuration for the first capacitor array and a second match configuration for the second capacitor array to create an impedance match between the fixed RF source impedance and the variable RF load impedance, the first match configuration and the second match configuration being determined from one or more look-up tables and based upon the detected one or more RF parameters; and altering at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

In yet another aspect, a method of fabricating a semiconductor including: placing a substrate in a plasma chamber configured to deposit a material layer onto the substrate or etch a material layer from the substrate; and energizing plasma within the plasma chamber by coupling RF power from an RF source into the plasma chamber to perform a deposition or etching, the RF source having a fixed RF source impedance, and the plasma chamber having a variable plasma impedance, wherein an impedance matching circuit includes an RF input coupled to the RF source and an RF output coupled to the plasma chamber, the impedance matching circuit including: a series electronically variable capacitor ("series EVC") including a first plurality of discrete capacitors and having a series array configuration which defines on and off states of the first plurality of discrete capacitors, the series EVC electrically coupled in series between the RF input and the RF output; and a shunt electronically variable capacitor ("shunt EVC") including a second plurality of discrete capacitors and having a shunt array configuration and which defines on and off states of the second plurality of discrete capacitors, the shunt EVC electrically coupled between a reference potential and one of the RF input and the RF output; detecting, while energizing the plasma, one or more RF parameters of the impedance matching circuit at one of the RF input of the impedance matching circuit or the RF output of the impedance matching circuit; determining, while energizing the plasma, a series match configuration for the series EVC and a shunt match configuration for the shunt EVC to create an impedance match between the fixed RF source impedance and the variable plasma impedance, the series match configuration and the shunt match configuration being determined from one or more look-up tables and based upon the detected one or more RF parameters; and altering, while energizing the plasma, at least one of the series array configuration and the shunt array configuration to the series match configuration and the shunt match configuration, respectively, by controlling the on and off states of (a) each discrete capacitor of the first plurality of discrete capacitors and (b) each discrete capacitor of the second plurality of discrete capacitors.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Figure 1:
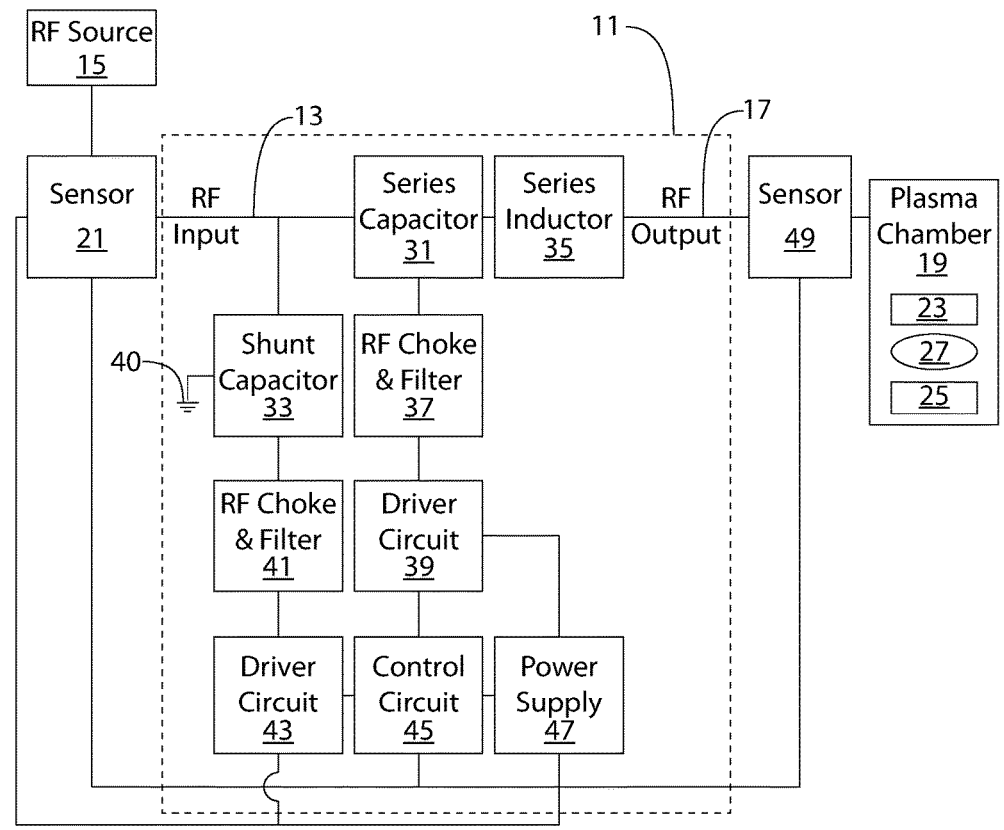
FIG. 1 is a schematic representation of an embodiment of an RF impedance matching network using EVCs incorporated into a semiconductor wafer fabrication system.

Turning in detail to the drawings, FIG. 1 illustrates an RF impedance matching network 11 having an RF input 13 connected to an RF source 15 and an RF output 17 connected to a plasma chamber 19. An RF input sensor 21 is connected between the RF impedance matching network 11 and the RF source 15 so that the RF signal output from the RF source 15 may be monitored. An RF output sensor 49 is connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

The RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

The RF impedance matching network 11 includes a series variable capacitor 31, a shunt variable capacitor 33, and a series inductor 35 configured as one form an 'L' type matching network. In the context of the present description, the series variable capacitor 31, the shunt variable capacitor 33, and the series inductor 35 form what is referred to as the "impedance matching circuit." The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17. Alternatively, the RF impedance matching network 11 may be configured in other matching network configurations, such as a 'T' type configuration or a 'Π' type configuration. In certain embodiments, the variable capacitors and the switching circuit described below may be included in any configuration appropriate for an RF impedance matching network.

Each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

Figure 2A:
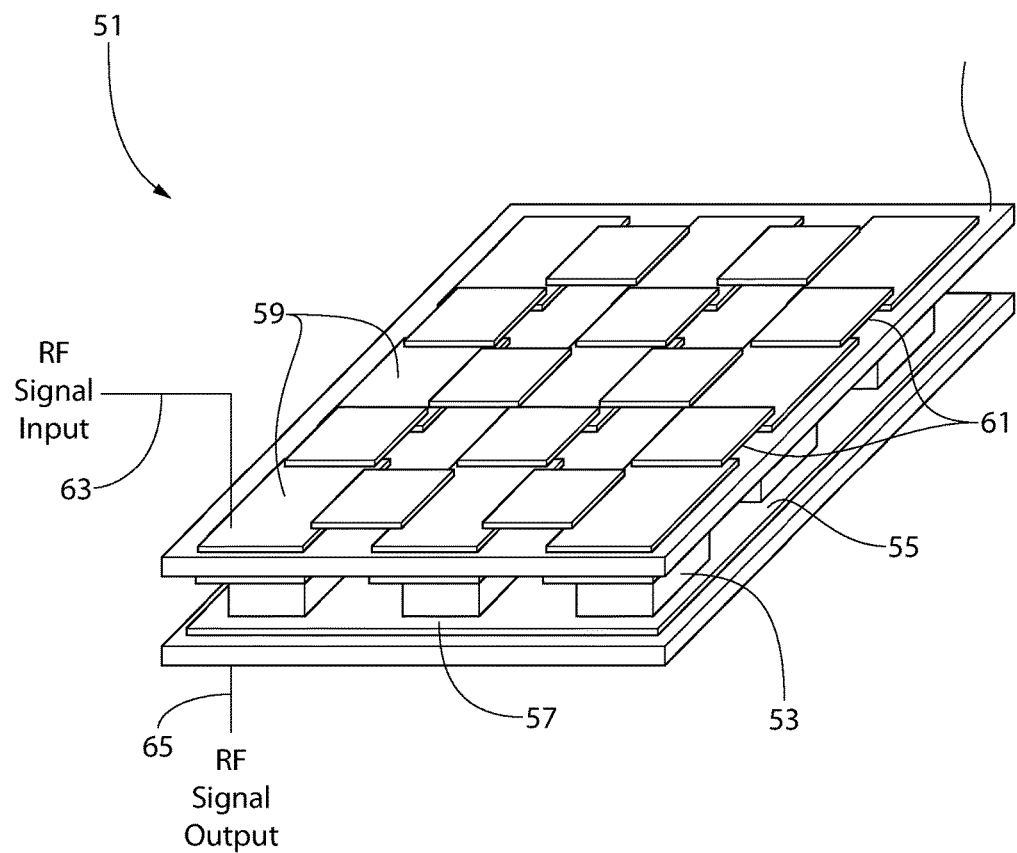
FIG. 2A illustrates an EVC for use in an RF impedance matching network.

The series and shunt variable capacitors 31, 33 may each be an electronically variable capacitor 51 such as is depicted in FIG. 2A. The electronically variable capacitor 51 includes a plurality of discrete capacitors 53 which form an array, and each discrete capacitor 53 has an electrode on opposite sides thereof, such as is typical of discrete capacitors that are available on the market.

Each discrete capacitor 53 has its individual bottom electrode 55 electrically connected to a common bottom electrode 57. The individual top electrode 59 of each discrete capacitor 53 is electrically connected to the individual top electrode 59 of adjacent discrete capacitors 53 through an electronic switch 61 that may be activated to electrically connect the adjacent top electrodes 59. Thus, the individual top electrodes 59 of each discrete capacitor 53 may be electrically connected to the top electrodes 59 of one or more adjacent discrete capacitors 53. The electronic switch 61 is selected and/or designed to be capable of switching the voltage and current of the RF signal. For example, the electronic switch 61 may be a PiN/NiP diode, or a circuit based on a PiN/NiP diode. Alternatively, the electronic switch 61 may be any other type of appropriate switch, such as a micro electro mechanical (MEM) switch, a solid state relay, a field effect transistor, and the like. One embodiment of the electronic switch 61, in combination with a driver circuit, is discussed in greater detail below.

In the configuration of the electronically variable capacitor 51 shown, each individual top electrode 59 may be electrically connected to between two to four adjacent top electrodes 59, with each connection being independently regulated by a separate electronic switch 61. The RF signal input 63 is electrically connected to one of the individual top electrodes 59, and the RF signal output 65 is electrically connected to the common bottom electrode 57. Thus, the electronic circuit through which the RF signal passes may include one, some, or all of the discrete capacitors 53 by a process of independently activating one or more of the electronic switches 61 coupled to adjacent ones of the individual top electrodes 59.

In other embodiments, the electronically variable capacitor 51 may be configured to have any layout for the individual top electrodes 59, to thereby increase or decrease the number of possible electrical connections between adjacent top electrodes 59. In still other embodiments, the electronically variable capacitor 51 may have an integrated dielectric disposed between the bottom electrode 57 and a plurality of top electrodes 59.

The electronic switch 61 that is used to connect pairs of adjacent top electrodes 59 may be a PiN/NiP diode-based switch, although other types of electronic switches may be used, such as a Micro Electro Mechanical (MEM) switch, a solid state relay, a field effect transistor, and the like. Each electronic switch 61 is switched by appropriate driver circuitry. For example, each of the series and 651 shunt driver circuits 39, 43 of FIG. 1 may include several discrete driving circuits, with each discrete driving circuit configured to switch one of the electronic switches 61 between an on state and an off state. By controlling the on and off states of each discrete capacitor 53 within the electronically variable capacitor 51, the capacitance of the electronically variable capacitor 51 may be controlled and varied. Each unique configuration of the on and off states of the plurality of discrete capacitors 53 is referred to herein as an "array configuration" of the variable capacitor 51, and each array configuration is associated with a capacitance of the electronically variable capacitor 51. In certain embodiments, each array configuration results in a unique capacitance for the electronically variable capacitor 51, so that there is a direct correlation between each array configuration and the capacitance value of the electronically variable capacitor 51.

Figure 2B:
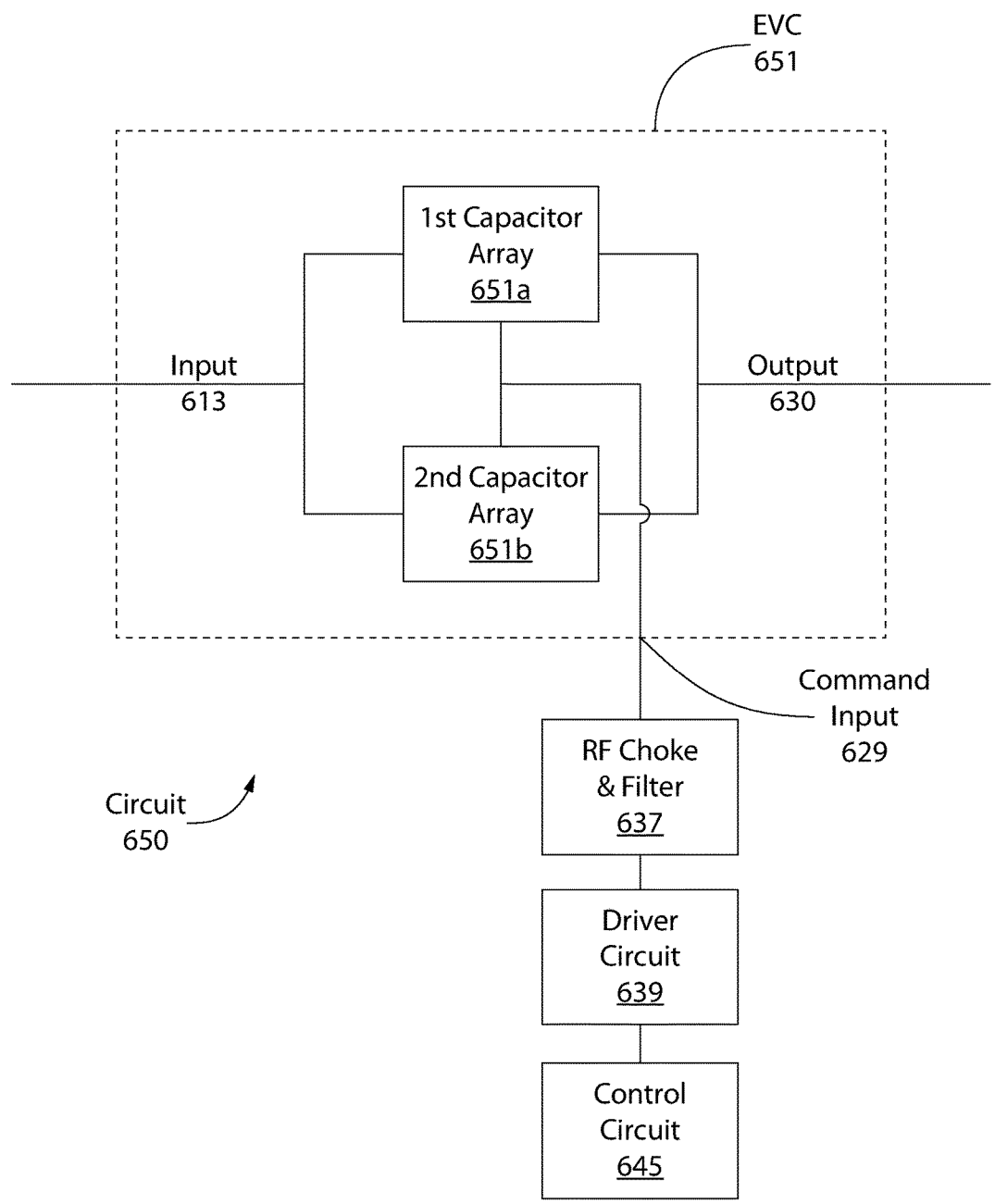
FIG. 2B is a schematic representation of an embodiment of an electronic circuit for providing a variable capacitance.

FIG. 2B shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630. The capacitor arrays 651a, 651b and their discrete capacitors may be arranged in manner similar to that shown in FIG. 2A, or in an alternative manner.

The first and second capacitance values can be any values sufficient to provide the desired overall capacitance values for the EVC 651. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 650 further includes a control circuit 645. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651a, 651b will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. The control circuit 645 can have features similar to those described with respect to control circuit 45 of FIG. 1. For example, the control circuit 645 can receive inputs from the capacitor arrays 651a, 651b, make calculations to determine changes to capacitor arrays 651a, 651b, and delivers commands to the capacitor arrays 651a, 651b for altering the capacitance of the EVC 651.

Figure 2C:
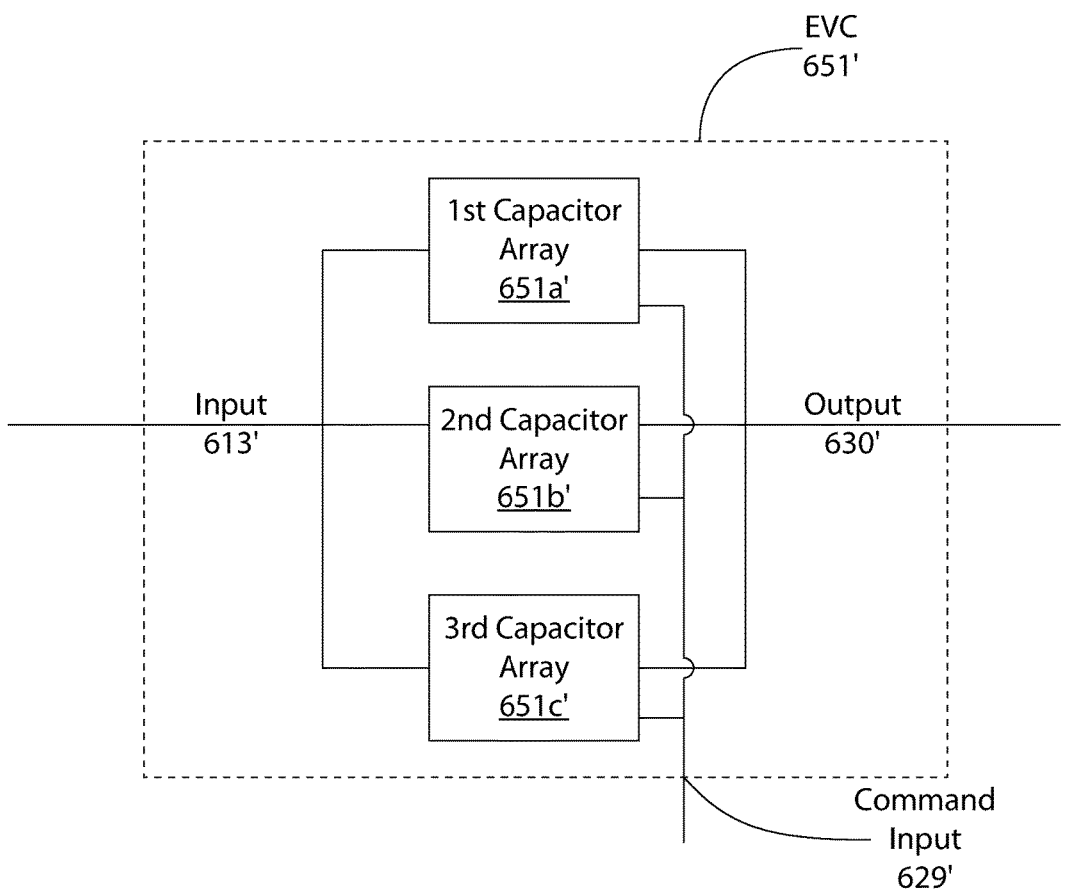
FIG. 2C is a schematic representation of an embodiment of an EVC having three capacitor arrays.

Similar to EVC 51 discussed with respect to FIG. 2A, the EVC 651 of FIGS. 2B and 2C can include a plurality of electronic switches. Each electronic switch can be configured to activate and deactivate one or more discrete capacitors.

As with the control circuit 45 of FIG. 1, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 1. In the exemplified embodiment, the driver circuit 639 is operatively coupled between the control circuit 645 and the first and second capacitor arrays 651a, 651b. The driver circuit 639 is configured to alter the variable capacitance based upon a control signal received from the control circuit 645. The RF filter 637 is operatively coupled between the driver circuit 639 and the first and second capacitor arrays 651a, 651b. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651a, 651b. In the exemplified embodiment, the control circuit 645 is configured to calculate a coarse capacitance value to be provided by controlling the on and off states of the first capacitor array 651a. Further, the control circuit is configured to calculate a fine capacitance value to be provided by controlling the on and off states of the second capacitor array 651b. In other embodiments, the capacitor arrays 651a, 651b can provide alternative levels of capacitance.

In other embodiments, the EVC can utilize additional capacitor arrays. FIG. 2C shows an embodiment of an EVC 651' in which a third capacitor array 651c' is utilized to provide an additional degree of control over the variable capacitance. Like the EVC 651 of FIG. 2B, the EVC 651' of FIG. 2C includes an input 613', an output 630', and a command input 629'. Similar to the first and second capacitor arrays 651a', 651b', the third capacitor array 651c' can have a third plurality of discrete capacitors. Each discrete capacitor of the third plurality of discrete capacitors can have a third capacitance value, this value being different from both the first capacitance value and the second capacitance value. The first capacitor array 651a', second capacitor array 651b', and third capacitor array 651c' can be coupled in parallel between the signal input 613' and the signal output 630'. A control circuit can be operably coupled to the third capacitor array 651c', and be further configured to alter the variable capacitance by controlling on and off states of each discrete capacitor of the third plurality of discrete capacitors. Additional capacitor arrays enable an EVC to utilize several different capacitance values in controlling the overall EVC capacitance. In other embodiments, the third plurality of discrete capacitors can be replaced with a single discrete capacitor, or an alternative device for varying the overall capacitance of the EVC 651'.

The first, second, and third capacitance values of EVC 651' can be any values sufficient to provide the desired overall capacitance values for EVC 651'. In one embodiment, the second capacitance value is less than or equal to one-half (½) of the first capacitance value, and the third capacitance value is less than or equal to one-half (½) of the second capacitance value. In another embodiment, the second capacitance value is less than or equal to one-third (⅓) of the first capacitance value, and the third capacitance value is less than or equal to one-third (⅓) of the second capacitance value.

The EVCs 651, 651' of FIGS. 2B and 2C, respectively, can be used in most systems requiring a varying capacitance. For example, the EVCs 651, 651' can be used as a series EVC and/or a shunt EVC in a matching network, such as the RF matching network 11 discussed above with respect to FIG. 1. It is often desired that the differences between the capacitance values allow for both a sufficiently fine resolution of the overall capacitance of the circuit and a wide range of capacitance values to enable a better impedance match at the input of a RF matching network, and EVCs 651, 651' allow this.

The EVCs 651, 651' can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, the EVC 651, 651' and circuit 650 can be used in other methods and systems to provide a variable capacitance.

Figure 3:
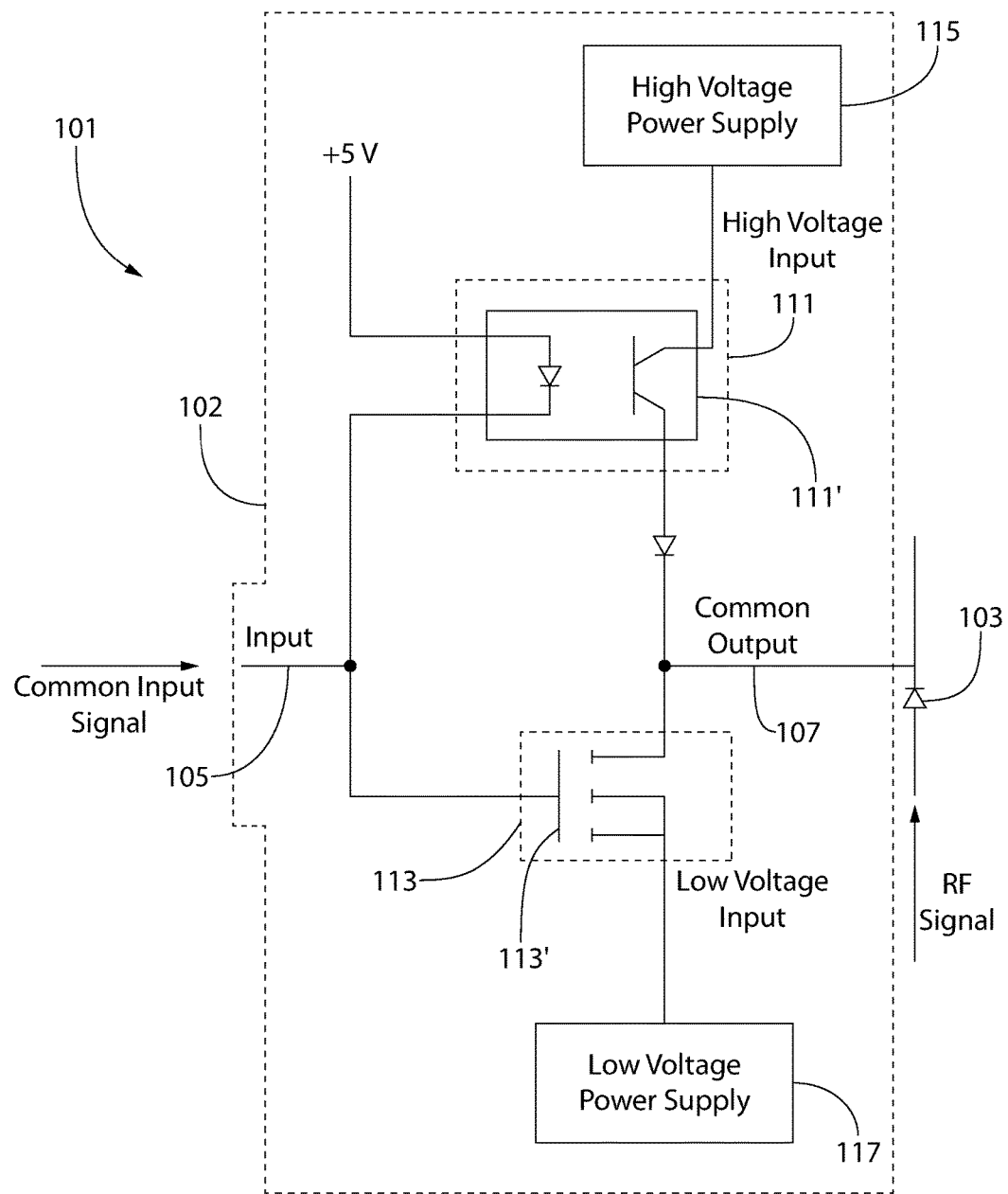
FIG. 3 illustrates a first switching circuit for use with an EVC.

FIG. 3 shows an embodiment of a high voltage switching circuit 101, which is shown including a driver circuit 102 and a PiN/NiP diode 103 as an electronic switch. Although this switching circuit is shown with the driver circuit 102 integrated with the PiN/NiP diode 103, one of skill in the art will understand that in practice, the PiN/NiP diode 103, or any other type of electronic switch, may be integrated with the discrete capacitors in an EVC that is part of an RF impedance matching network, with the RF choke and filter circuit connected between the output of the driver circuit 102 and the PiN/NiP diode 103.

The switching circuit 101 may be used for switching one of the discrete capacitors in an EVC between an 'ON' state and an 'OFF' state. One of skill in the art will recognize that the use of the PiN/NiP diode 103 in this embodiment is exemplary, and that the switching circuit 101 may include other types of circuitry that does not include the PiN/NiP diode 103, yet still provides some of the same fast switching advantages of the PiN/NiP diode 103 for switching one of the discrete capacitors in an EVC. One of skill in the art will also recognize that certain components of the driver circuit 102 may be replaced with other components that perform the same essential function while also greater allowing variability in other circuit parameters (e.g., voltage range, current range, and the like).

This driver circuit 102 has an input 105 which receives a common input signal for controlling the voltage on the common output 107 that is connected to and drives the PiN/NiP diode 103. The voltage on the common output 107 switches the PiN/NiP diode 103 between the 'ON' state and the 'OFF' state, thus also switching 'ON' and 'OFF' the discrete capacitor to which the PiN/NiP diode 103 is connected. The state of the discrete capacitor, in this exemplary embodiment, follows the state of the state of the PiN/NiP diode 103, such that when the PiN/NiP diode 103 is 'ON', the discrete capacitor is also 'ON', and likewise, when the PiN/NiP diode 103 is 'OFF', the discrete capacitor is also 'OFF'. Thus, statements herein about the state of the PiN/NiP diode 103 inherently describe the concomitant state of the connected discrete capacitor of the EVC.

The input 105 is connected to both a first power switch 111 and into a second power switch 113. As depicted, the first power switch 111 is an optocoupler phototransistor 111', and the second power switch 113 is a MOSFET 113'. A high voltage power supply 115 is connected to the first power switch 111, providing a high voltage input which is to be switchably connected to the common output 107. A low voltage power supply 117 is connected to the second power switch 113, providing a low voltage input which is also to be switchably connected to the common output 107. In the configuration of the driver circuit 102 shown, the low voltage power supply 117 may supply a low voltage input which is about −5 V. Such a low voltage, with a negative polarity, is sufficient to provide a forward bias for switching the PiN/NiP diode 103. For other configurations of the driver circuit 102, a higher or lower voltage input may be used, and the low voltage input may have a positive polarity, depending upon the configuration and the type of electronic switch being controlled.

The common input signal asynchronously controls the 'on' and 'off' states of the first power switch 111 and the second power switch 113, such that when the first power switch 111 is in the 'on' state, the second power switch 113 is in the 'off' state, and similarly, when the first power switch is in the 'off' state, the second power switch 113 is in the 'on' state. In this manner, the common input signal controls the first power switch 111 and the second power switch 113 to asynchronously connect the high voltage input and the low voltage input to the common output for purposes of switching the PiN/NiP diode 103 between the 'ON' state and the 'OFF' state.

The input 105 may be configured to receive any type of appropriate control signal for the types of switches selected for the first power switch 111 and the second power switch 113, which may be, for example, a +5 V control signal. Of course, to maintain simplicity of the overall driver circuit 102 and avoid incurring additional manufacturing costs, the first and second power switches 111, 113 are preferably selected so that they may directly receive the common input signal without requiring additional circuitry to filter or otherwise transform the common input signal.

The switching circuit 101 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 101 is that it provides the ability to switch the common output between voltage modes quickly, within the time frame of about 15 μsec or less. The simplicity of the switching circuit 101 should considerably reduce manufacturing costs, especially when compared to other circuits performing similar functionality, and it should also significantly reduce space requirements for the circuit, and again, especially as compared to other circuits performing similar functionality. These advantages make the switching circuit 101 particularly advantageous with the incorporated PiN/NiP diode 103.

One of the ways in which these advances are realized is the first power switch 111 being a monolithic circuit element, such as the optocoupler phototransistor 111'. A monolithic element reduces both cost and space requirements. When an optocoupler phototransistor 111' is used as the monolithic element, it can perform the necessary high voltage switching quickly, and it serves to isolate the high voltage input from the common input signal. Other, as yet unrealized advantages may also be present through the use of an optocoupler phototransistor 111'.

An optocoupler phototransistor 111' serves well as the first power switch 111 for use in conjunction with the PiN/NiP diode 103 because of the low current requirements for the PiN/NiP diode 103 when in the 'OFF' state. During the 'OFF' state, the PiN/NiP diode 103 is reverse biased, and thus non-conducting, and as such the 'OFF' state current requirement falls within the current handling capability of most optocoupler phototransistors. In addition, in implementations when one or both of the voltage requirements or the current requirements exceed the specifications for a single optocoupler phototransistor, additional optocoupler phototransistors may be added into the circuit in series or in parallel to increase the voltage and/or current handling capabilities of the switching circuit.

To further highlight the advantages of the switching circuit 101, its operation is detailed when the first power switch 111 is an optocoupler phototransistor 111' and the second power switch 113 is an appropriate MOSFET 113'. In this example, the common input signal may be a 5 V control signal which is alternated between a first voltage level and a second voltage level that serve to switch both the optocoupler phototransistor 111' and the MOSFET 113' between 'on' and 'off' states. The manner of implementing a 5 V control signal is well known to those of skill in the art.

When the PiN/NiP diode 103 is to be turned to the 'OFF' state, the optocoupler phototransistor 111' is turned to the 'on' state by applying the first voltage level from the common input signal across the photodiode inputs of the optocoupler phototransistor 111'. Turning the optocoupler phototransistor 111' to the 'on' state connects high voltage input to the common output 107, thereby reverse biasing the PiN/NiP diode 103. At the same time, during this 'OFF' state of the PiN/NiP diode 103, application of the first voltage level from the common input signal to the MOSFET 113' places the MOSFET 113' in the 'off' state, thereby disconnecting low voltage input from the common output 107.

When the PiN/NiP diode 103 is to be turned to the 'ON' state, the optocoupler phototransistor 111' is turned to the 'off' state by applying the second voltage level from the common input signal across the photodiode inputs of the optocoupler phototransistor 111'. Turning the optocoupler phototransistor 111' to the 'off' state disconnects high voltage input from the common output 107. At the same time, application of the second voltage level from the common input signal to the MOSFET 113' places the MOSFET 113' in the 'on' state, thereby connecting the low voltage input to the common output 107. With the MOSFET 113' in the 'on' state, and the optocoupler phototransistor 111' to the 'off' state, only the low voltage input is connected to the common output 107, so that the PiN/NiP diode 103 is forward biased and placed in the 'ON' state.

As indicated above, the optocoupler phototransistor 111' provides the advantage that the common input signal is electrically isolated, through the internal optical switch (not shown) of the optocoupler phototransistor 111', from the switched high voltage, thus alleviating the need to float the drive circuit (such as when a MOSFET is used to switch the high voltage). Use of the optocoupler phototransistor 111' provides the additional advantage that the driver circuit 102 can quickly switch the common output 107 between the high voltage input and the low voltage input, with the switching occurring within the time frame of about 15 μsec or less. This fast switching time helps reduce switching loss, thereby reducing stress on the PiN/NiP diode itself, and introduces improvements in the semiconductor fabrication process by reducing the amount of time it takes for the RF impedance matching network to create an impedance match between the RF source and the plasma chamber.

The use of optocoupler phototransistors in the driver circuit 102 also provides advantages for switching a high voltage input in the range of 500 V-1000 V. Higher or lower voltages may also be switched with this driver circuit 102. The high voltage input may therefore differ from the low voltage input by at least two or three orders of magnitude, or more. Advantageously, when the switching circuit 101 incorporates the PiN/NiP diode 103, the high voltage input and the low voltage input may have opposite polarities.

Figure 4:
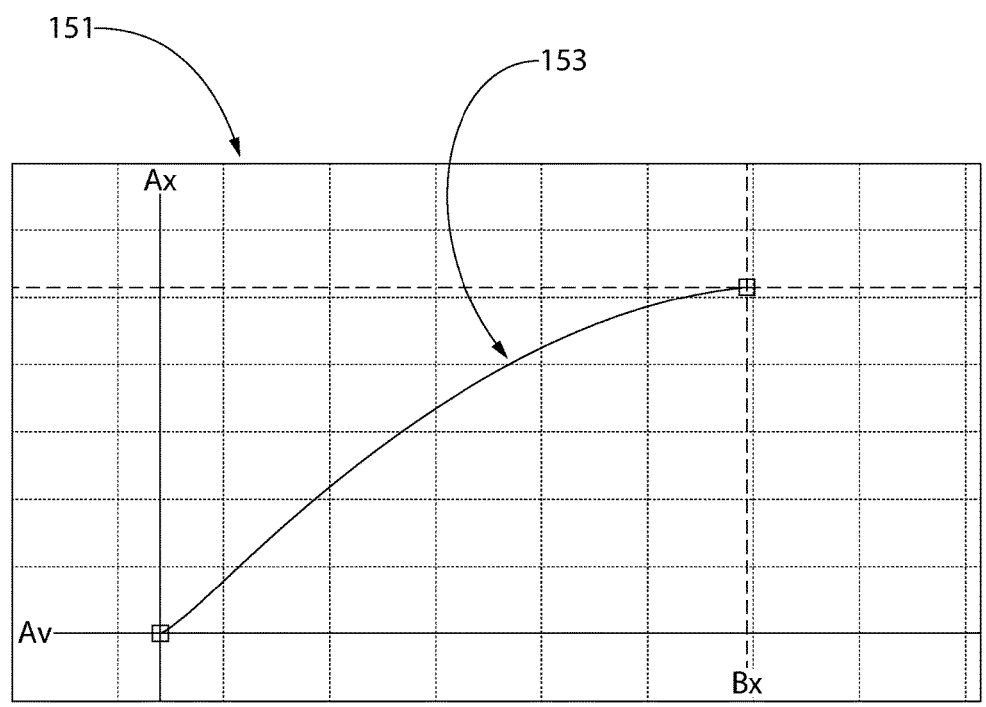
FIG. 4 is a graphical representation showing the timing capabilities of a driver circuit to switch to high voltage on the common output.
Figure 5:
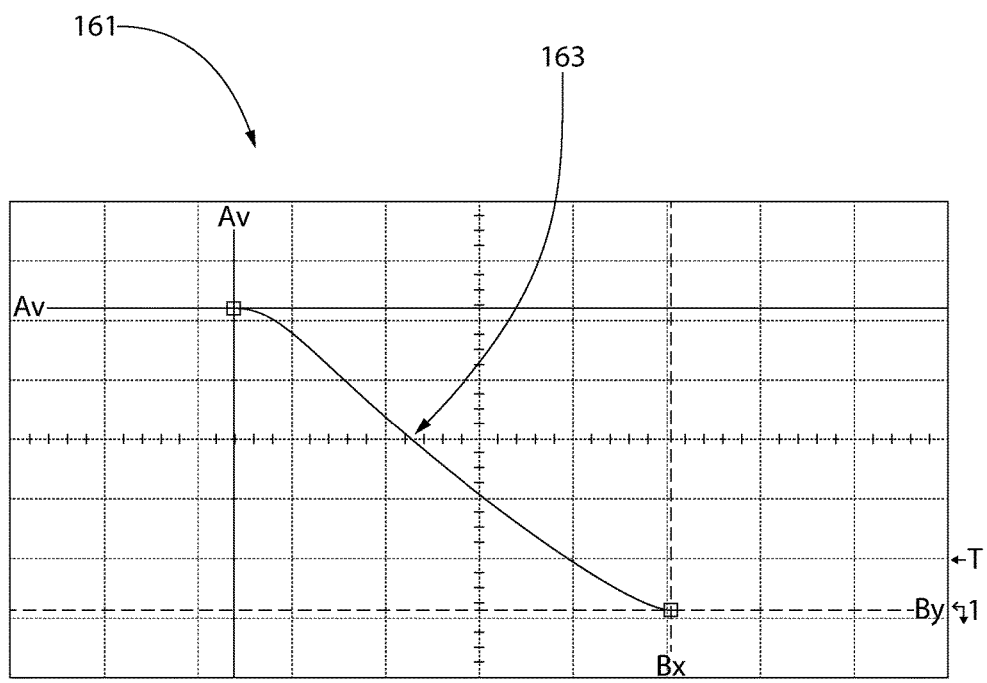
FIG. 5 is a graphical representation showing the timing capabilities of a driver circuit to switch to low voltage on the common output.

The ability of the driver circuit 102 to provide quick switching capabilities is exemplified by the graphs 151, 161 of FIGS. 4 and 5. The voltage curve 153 of FIG. 4 shows the voltage on the common output 107 of the driver circuit 102 in order to switch the connected PiN/NiP diode 103 to the 'OFF' state. As is shown by the voltage curve 153, the driver circuit 102 is capable of switching to connect the high voltage input, which in this example is approximately 1,000 V, to the common output 107 within about 11 μsec. The voltage curve 163 of FIG. 5 shows the voltage on the common output 107 of the driver circuit 102 in order to switch the connected PiN/NiP diode 103 to the 'ON' state. As is shown by the voltage curve 163, the driver circuit 102 is capable of switching to connect the low voltage input, which in this example is approximately −12 V, to the common output 107 within about 9 μsec. Thus, an RF impedance matching network which includes EVCs and switching circuits, as described above, shows significant improvements as compared to an RF impedance matching network which includes VVCs.

Figure 6A:
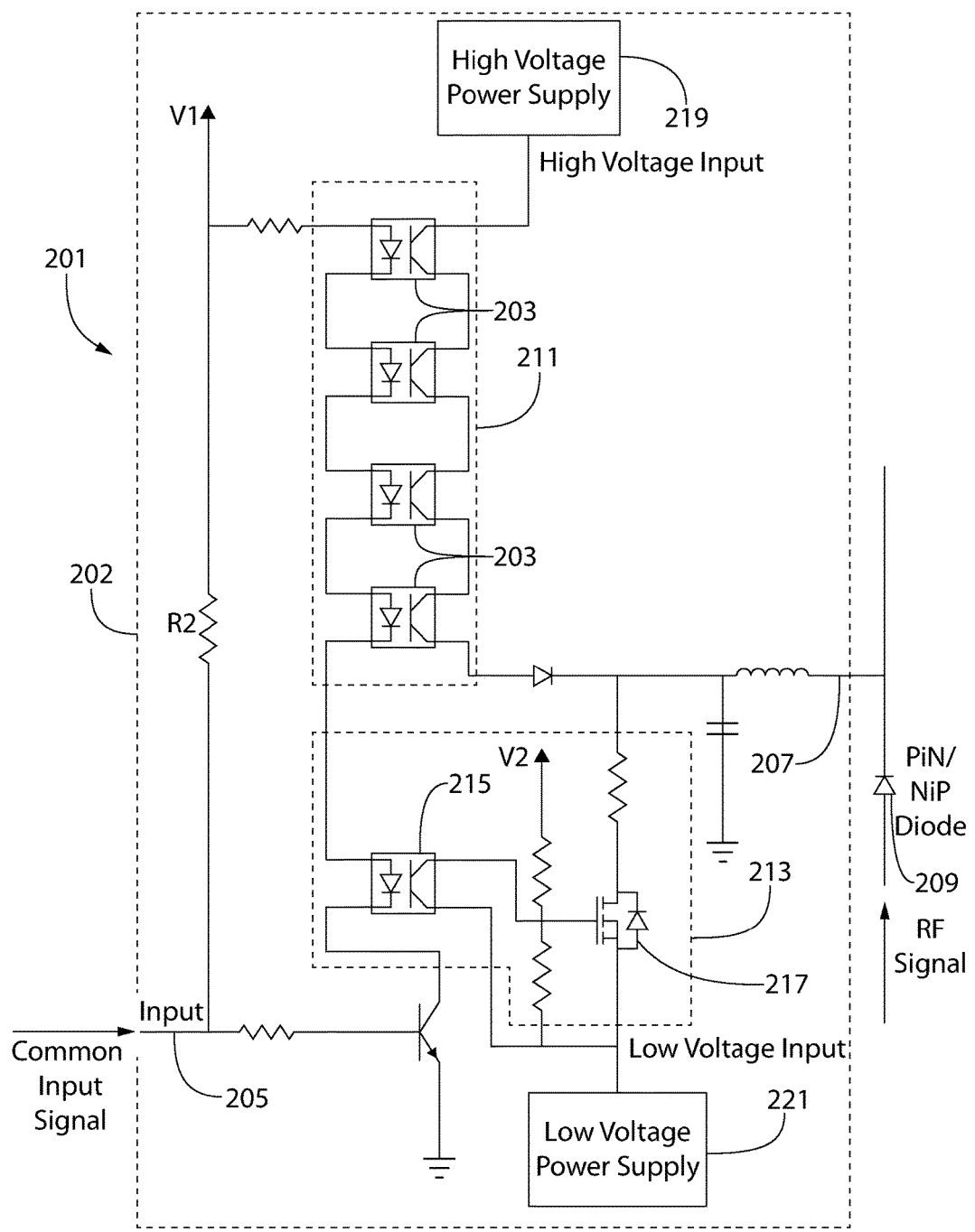
FIG. 6A illustrates a second switching circuit for use with an EVC.

A switching circuit 201 which includes a driver circuit 202 having multiple optocoupler phototransistors 203 to increase the high voltage capabilities is shown in FIG. 6A. Like the driver circuit 102 of FIG. 3, this driver circuit 202 includes an input 205 which receives a common input signal for controlling the voltage on the common output 207. The switching circuit 201 includes a PiN/NiP diode 209 connected to the common output 207, and the voltage on the common output 207 may be used to switch the PiN/NiP diode 209 between 'ON' state and 'OFF' states. The input 205 is connected to both a first power switch 211, which includes the optocoupler phototransistors 203, and to a second power switch 213, which includes another optocoupler phototransistor 215 and a MOSFET 217.

A high voltage power supply 219 is connected to the first power switch 211, providing a high voltage input which is to be switchably connected to the common output 207. A low voltage power supply 221 is connected to the second power switch 213, providing a low voltage input which is also to be switchably connected to the common output 207.

The optocoupler phototransistors 203 of the first power switch 211 are connected in series to each other in order to enable the first power switch 211 to switch higher voltages onto the common output 207 in the same manner as discussed above with a single optocoupler phototransistor. With appropriate selection of the optocoupler phototransistors 203, the first power switch 211, as shown, is capable of switching about 1000 V or more from the high voltage power supply 219 to the common output 207. Additional optocoupler phototransistors may be added in series for the first power switch 211 to increase the high voltage switching capabilities. One of skill in the art will recognize that one or more optocoupler phototransistors may be connected in parallel to each other to increase the current load capabilities of the first power switch 211. One optocoupler phototransistor may be used to switch low voltages through the design rating of the optocoupler phototransistor, with more optocoupler phototransistors being added to switch higher voltages.

The optocoupler phototransistor 215 of the second power switch 213 receives the common input signal, like the optocoupler phototransistors 203 of the first power switch 211. This optocoupler phototransistor 215 is connected to the MOSFET 217 and places the MOSFET 217 in the 'off' state by connecting the source to the gate when the common input signal places the first power switch 211 in the 'on' state. In this configuration, when the MOSFET 217 is in the 'on' state, the second power switch 213 is also in the 'on' state, connecting the low power input to the common output 207. Likewise, when the MOSFET 217 is in the 'off' state, the second power switch 213 is also in the 'off' state, so that the low power input is disconnected from the common output 207. When the first power switch is in the 'off' state, optocoupler phototransistor 215 disconnects the gate from the source, so that the MOSFET 217 placed in the 'on' state by the gate being connected to the voltage V2, which is an appropriate voltage for controlling the gate of the MOSFET 217.

Figure 6B:
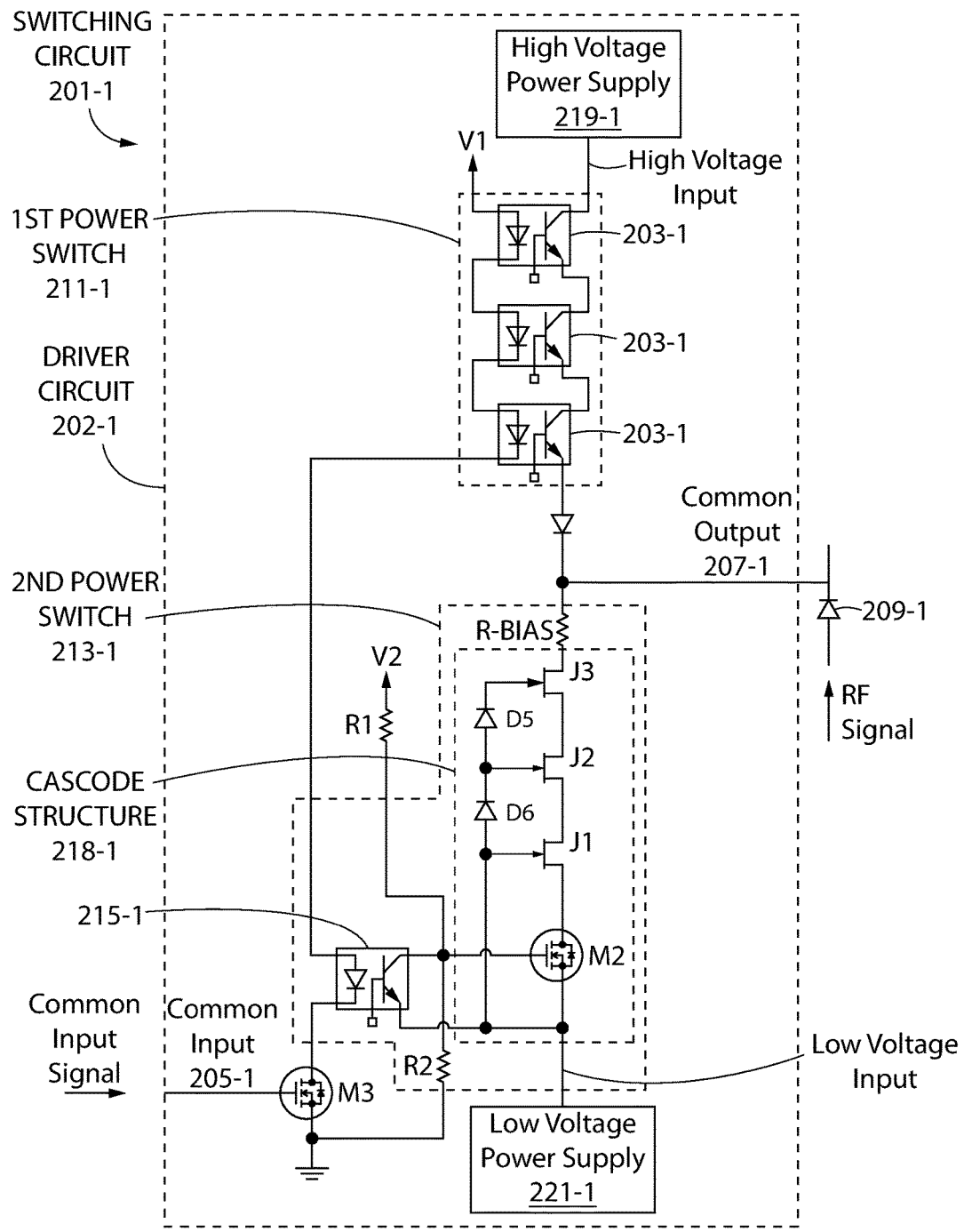
FIG. 6B illustrates a third switching circuit for use with an EVC.

FIG. 6B shows a switching circuit 201-1 according to yet another embodiment of the invention. In this embodiment, the switching circuit 201-1 can utilize a cascode structure 218-1 to increase high voltage capabilities and increase switching speed while providing a simple control scheme.

In the exemplified embodiment, the switching circuit 201-1 includes a driver circuit 202-1 (sometimes referred to as a control circuit) and a PiN/NiP diode 209-1. As in other embodiments, the driver circuit 202-1 includes an input 205-1 that receives a common input signal for controlling the voltage on the common output 207-1. The PiN/NiP diode 209-1 is connected to the common output 207-1, and the voltage on the common output 207-1 may be used to switch the PiN/NiP diode 209-1 between 'ON' and 'OFF' states. The common input 205-1 is connected to both a first power switch 211-1 and a second power switch 213-1.

As with switching circuits 101 and 201, switching circuit 201-1 may be used for switching one of the discrete capacitors in an EVC between an 'ON' state and an 'OFF' state. One of skill in the art will recognize that the use of the PiN/NiP diode 209-1 in this embodiment is exemplary, and that the switching circuit 201-1 may include other types of circuitry that does not include the PiN/NiP diode 209-1, yet still provides some of the same advantages of the PiN/NiP diode 209-1 for switching one of the discrete capacitors in an EVC. One of skill in the art will also recognize that certain components of the driver circuit 202-1 may be replaced with other components that perform the same essential function while also greater allowing variability in other circuit parameters (e.g., voltage range, current range, and the like). One of skill in the art will also recognize that certain commonly known components have been omitted from discussion for clarity.

The PiN/NiP diode 209-1 is configured to receive an RF signal. In the exemplified embodiment, the RF signal is a high voltage RF signal (e.g., 1000 V peak amplitude, 3000 V peak amplitude, or 4000 V peak amplitude). Accordingly, a high voltage power supply (e.g., 1200 VDC for a 1000V peak amplitude RF signal) is required to reverse bias the PiN/NiP diode 209-1 and thereby turn the switching circuit 201-1 'OFF'. The high voltage of the high voltage power supply 219-1 can be two orders of magnitude or more greater than the low voltage of the low voltage power supply 221-1.

The high voltage power supply 219-1 is connected to the first power switch 211-1, providing a high voltage input which is to be switchably connected to the common output 207-1. A low voltage power supply 221-1 is connected to the second power switch 213-1, providing a low voltage input which is also to be switchably connected to the common output 207-1. In the configuration of the driver circuit 202-1 shown, the low voltage power supply 221-1 may supply a low voltage input which is about −5 V. Such a low voltage, with a negative polarity, is sufficient to provide a forward bias for switching the PiN/NiP diode 209-1. For other configurations of the driver circuit 202-1, a higher or lower voltage input may be used, and the low voltage input may have a positive polarity, depending upon the configuration and the type of electronic switch being controlled.

The common input signal asynchronously controls the 'on' and 'off' states of the first power switch 211-1 and the second power switch 213-1, such that when the first power switch 211-1 is in the 'on' state, the second power switch 213-1 is in the 'off' state, and similarly, when the first power switch 211-1 is in the 'off' state, the second power switch 213-1 is in the 'on' state. In this manner, the common input signal controls the first power switch 211-1 and the second power switch 213-1 to asynchronously connect the high voltage input and the low voltage input to the common output for purposes of switching the PiN/NiP diode 209-1 between the 'ON' state and the 'OFF' state.

The common input 205-1 may be configured to receive any type of appropriate control signal for the types of switches selected for the first power switch 211-1 and the second power switch 213-1, which may be, for example, a +5 V control signal.

The switching circuit 201-1 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 201-1 is that it can provide the ability to switch the common output between voltage modes quickly, within the time frame of about 5 μsec or less. The simplicity of the switching circuit 201-1 should considerably reduce manufacturing costs, especially when compared to other circuits performing similar functionality, and it should also significantly reduce space requirements for the circuit, and again, especially as compared to other circuits performing similar functionality. These advantages make the switching circuit 201-1 particularly advantageous with the incorporated PiN/NiP diode 209-1.

Similar to first power switches 111 and 211, first power switch 211-1 can utilize at least one optocoupler phototransistor 203-1. (The terms optocoupler and optocoupler phototransistor are used interchangeably herein.) In the exemplified embodiment, three optocoupler phototransistors 203-1 are utilized. The high voltage power supply 219-1 is connected to the collector port of the topmost optocoupler phototransistor 203-1. Advantages of the use of optocoupler phototransistors in the first power switch are discussed above. The optocoupler phototransistors 203-1 of the first power switch 211-1 are connected in series to each other to enable the first power switch 211-1 to switch higher voltages onto the common output 207 in a manner similar to that discussed above. With appropriate selection of the optocoupler phototransistors 203-1, the first power switch 211-1 is capable of switching 1000 V or more from the high voltage power supply 219-1 to the common output 207-1. In other embodiments, additional optocoupler phototransistors may be added in series for the first power switch 211-1 to increase the high voltage switching capabilities. In yet other embodiments, fewer optocoupler phototransistors may be used, including use of a single optocoupler phototransistor.

The second power switch 213-1 can include a cascode structure 218-1 designed to increase the blocking voltage capability of the switching circuit 201-1. The cascode structure 218-1 includes multiple JFETs J1, J2, J3 in series. These JFETs are connected in series with a low-voltage MOSFET M2. As a non-limiting example, the JFETs can be 1700 VDC JFETs, while and the MOSFET can be a 30V MOSFET. Specifically, the MOSFET M2 is connected in series between the JFETs J1, J2, J3 the and low voltage power supply. Between each of the JFET gates is a diode D5, D6. In other embodiments, a single JFET (rather than multiple JFETs) can be utilized for the cascode structure. A voltage source V2 is connected to the gate of MOSFET M2. The voltage source V2 is also connected to optocoupler phototransistor 215-1 (sometimes referred to as input optocoupler 215-1). When the optocoupler phototransistor 215-1 is turned on, the optocoupler phototransistor 215-1 can essentially short the gate of MOSFET M2 to the source of MOSFET M2, turning MOSFET M2 'off'. It is noted that the JFETs, MOSFETs, and optocoupler phototransistors can be replaced with other appropriate transistors or switches. Accordingly, a JFET such as one of JFETs J1, J2, J3 can be referred to as a first transistor, and a MOSFET such as MOSFET M2 can be referred to as a second transistor.

When the PiN/NiP diode 209-1 is in the 'ON' state, the first power switch 211-1 is in the 'off' state and the second power switch 213-1 is in the 'on' state. In the exemplified embodiment, the PiN/NiP diode 209-1 is put in the 'ON' state by applying a first common input signal of +0 V at the common input 205-1. When the +0 V first common input signal is applied, input MOSFET M3 (which can be another type of transistor, such as a BJT, and is sometimes referred to as the input transistor) is turned 'off'. Consequently, no current flows through the photodiode inputs of the optocoupler phototransistors 203-1, 215-1. Thus, the optocoupler transistors 203-1, 215-1 are turned 'off', common output 207-1 does not receive high voltage from the high voltage power supply 219-1, and the diode 209-1 is not reverse biased.

At the same time, since optocoupler 215-1 is 'off', the gate of MOSFET M2 can receive a voltage from voltage V2. R1 and R2 form a voltage divider for voltage V2, so that the gate of MOSFET M2 receives a divided voltage from V2. In the exemplified embodiment, voltage V2 is +5 V. The receipt of divided voltage V2 at the gate of MOSFET M2 causes MOSFET M2 to switch 'on', which turns 'on' the first JFET J1 since the gate of first JFET J1 is then connected to its source. Next, the second JFET J2 can start conducting and turn 'on', since the voltage on the gate of JFET J5 is $-V_F$ (the forward voltage drop of diode D6). The same process can be repeated for turning 'on' the remaining JFETs (third JFET J3), until the voltage of the low voltage power supply 221-1 appears at the common output 207-1, thereby providing the necessary biasing voltage to forward bias PiN/NiP diode 209-1.

With the MOSFET M2 in the 'on' state, and the optocoupler phototransistors 203-1, 215-1 in the 'off' state, only the low voltage input is connected to the common output 209-1, so that the PiN/NiP diode 209-1 is forward biased and placed in the 'ON' state. When the optocouplers 203-1 of the first power switch are switched off, a voltage drop from the high voltage (of high voltage power supply 219-1) to the low voltage (of the low voltage power supply 221-1) occurs across the plurality of optocouplers.

By contrast, when the PiN/NiP diode 209-1 is in the 'OFF' state, the first power switch 211-1 is in the 'on' state and the second power switch 213-1 is in the 'off' state. In the exemplified embodiment, the PiN/NiP diode 209-1 is put in the 'ON' state by applying a second common input signal of +5 V at the common input 205-1. When the +5 V first common input signal is applied, input MOSFET M3 is turned 'on'. Consequently, current flows through the photodiode inputs of the optocoupler phototransistors 203-1, 215-1. Thus, the optocoupler transistors 203-1, 215-1 are turned 'on', and common output 207-1 receives high voltage from the high voltage power supply 219-1 to reverse bias diode 209-1.

At the same time, the gate of MOSFET M2 does not receive voltage V2, because optocoupler 215-1 is 'on', and therefore diverts voltage from the gate of MOSFET M2. Since the gate of MOSFET M2 does not receive voltage V2, MOSFET M2 switches 'off', which causes JFETS J1, J2, J3 to turn off, thereby preventing the low voltage of the low voltage power supply 221-1 to appear at the common output 207-1.

In this state, where the first power switch 211-1 is switched 'on' and the second power switch 213-1 is switched 'off', the high voltage power source can cause a large voltage across the MOSFET M2 and the JFETs J1, J2, J3. One benefit of this structure is that the MOSFET M2 can be a low-voltage MOSFET (e.g., 30 V), while the JFETs J1, J2, J3 can be higher-voltage JFETS (e.g., 1700 V) for handling the high voltage from the high voltage power source. For different applications, the MOSFET M2 can remain the same (in number and type), while the number or type of JFETs can be adjusted to handle the voltage requirements. Building a higher voltage switch can be achieved by simply adding one or more JFETs in series with the existing JFETs. There is no need to alter the switch configuration or how the switch needs to be driven. In this manner, the cascode structure increases the blocking voltage capability of the switching circuit.

With MOSFET M2 in the 'off' state, and the optocoupler phototransistors 203-1, 215-1 in the 'on' state, only the high voltage input is connected to the common output 209-1, so that the PiN/NiP diode 209-1 is reverse biased and placed in the 'ON' state.

Figure 7:
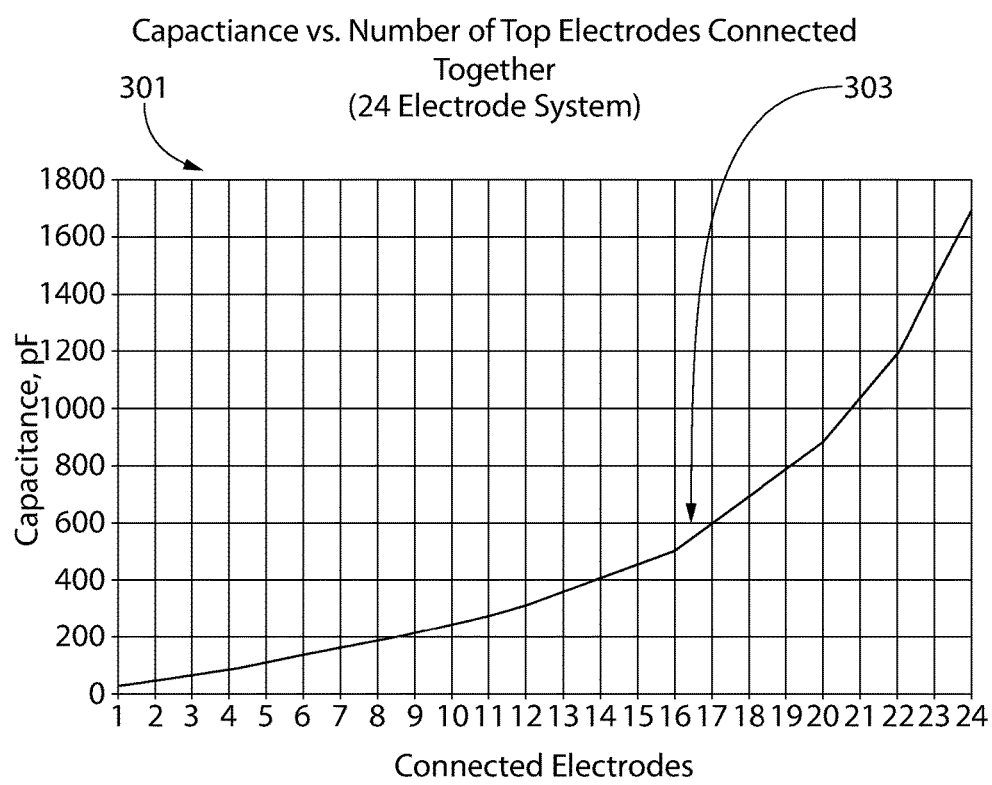
FIG. 7 is a graph showing the capacitance range of an EVC.

The non-linear capacitance range of a single EVC switched by a switching circuit is shown in the graph 301 of FIG. 7. The single EVC used to generate the capacitance curve 303 has 24 discrete capacitors in the manner described above, with the top electrodes of the discrete capacitors being selectively connected to arrive at the capacitance curve 303 shown. As can be seen, the single EVC may provide a capacitance ranging from only one active discrete capacitor (i.e., none of the top electrodes of any of the discrete capacitors are connected, so that the RF signal only flows through a single discrete capacitor) to all 24 discrete capacitors being active (i.e., all the top electrodes of all the discrete capacitors are connected). Any number of the 24 discrete capacitors may be connected, so that the capacitance of the single EVC may range from a low capacitance, with one active discrete capacitor as part of the array configuration, to a high capacitance, with all 24 discrete capacitors active as part of the array configuration. The low capacitance and the high capacitance are a matter of design choice for the EVC. In the capacitance curve shown, the low capacitance is about 25 pF, while the high capacitance is over 1,600 pF. The number of discrete capacitance values that is achievable between the low capacitance and the high capacitance is also a matter of design choice for the EVC, as more or fewer discrete capacitors may be included as part of the EVC. The only significant constraints on an EVC are the mechanical limitations posed by specific implementations (e.g., size or weight restrictions on the EVC). Mechanical limitations aside, an EVC does not appear to have any issues for achieving high value capacitance (e.g., 200,000 pF or higher).

Figure 8:
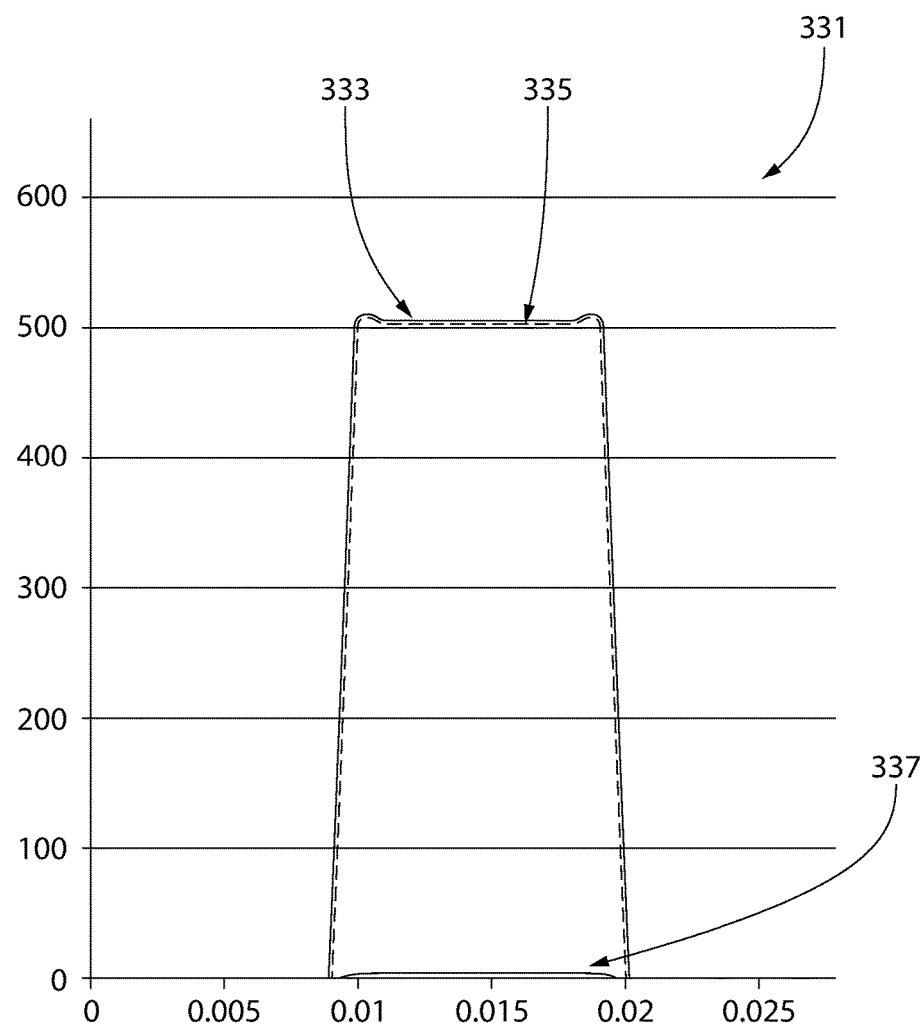
FIG. 8 is a graph showing the stable delivered power and the low reflected power that an impedance matching network including EVCs may provide during tuning.

The stable delivered power of an RF impedance matching network incorporating EVCs is shown in the graph 331 of FIG. 8, which does not show or take into account switching capabilities of an EVC controlled by a switching circuit. There are three curves shown in this graph 331: the output power 333 of the RF signal output from the RF source, which is about 500 V; the delivered power 335 to the plasma chamber; and the reflected power 337 back to the RF source. The output power 333 is a little over 500 V, while the reflected power 337 is in the range of about 10 V, so that the delivered power 335 to the plasma chamber is about 500 V. Not only is the delivered power 335 about 98% of the output power 333, but the delivered power 335, as can be seen, is substantially stable, without significant fluctuations. Both the percentage of delivered power 335 and the stability of the delivered power 335 represent significant improvements over an RF impedance matching network that is based on VVCs.

Figure 9:
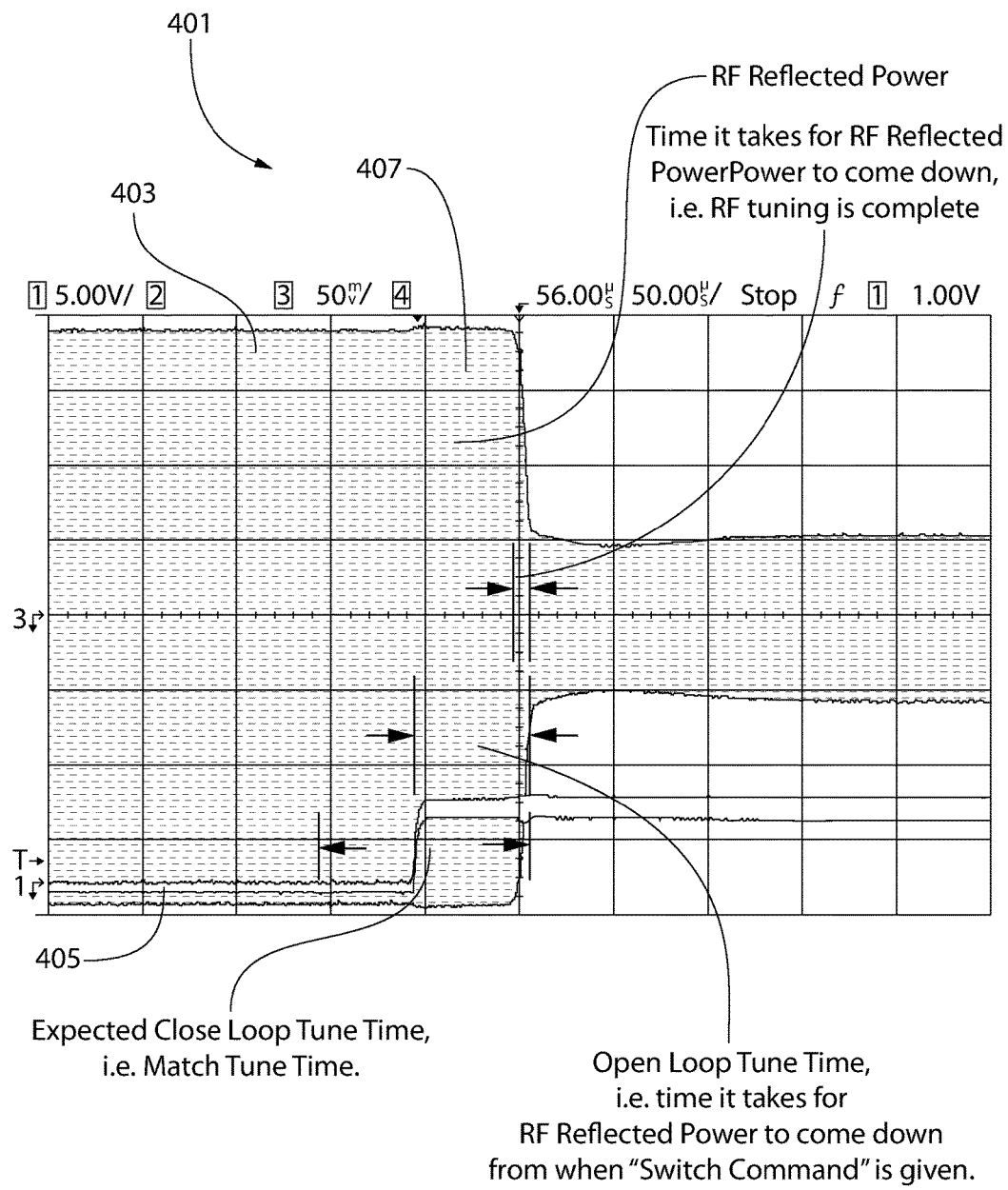
FIG. 9 is a graphical representation showing the reflected RF power profile through an RF impedance matching network using EVCs and showing the voltage supplied to the driver circuit for the EVCs.

When the switching capabilities of an EVC controlled by a switching circuit, in the manner described above, are incorporated into an RF impedance matching network, high speed switching is enabled for the RF impedance matching network. FIG. 9 is a graph 401 having voltage along the two y-axes and time along the x-axis to show the speed at which an RF impedance matching network using EVCs performs impedance matching (also referred to as the "match tune process"). A representation of an RF power profile 403 is shown, taken at the RF input of an RF impedance matching network, and the y-axis for the RF power profile has 50 mV divisions. A representation of the voltage of the common input signal 405 for driver circuits is also shown in the lower portion of the graph 401, the common input signal 405 originating from the control circuit of the RF impedance matching network, and the y-axis for the common input signal 405 has 5 V divisions. The x-axis has 50 μsec divisions, with the 56 μsec point marked in approximately the middle of the graph and the t=0 point as marked.

Initially, a significant amount of reflected power 407 is shown in the left portion of the RF power profile 403 (i.e., before the 56 μsec mark). This reflected power represents inefficiencies in the RF power being transferred between the RF source and the plasma chamber as a result of an impedance mismatch. At about t=−36 μsec, the match tune process begins. The first approximately 50 μsec of the match tune process is consumed by measurements and calculations performed by the control circuit in order to determine new values for the variable capacitances of one or both of the series and shunt EVCs.

Figure 10:
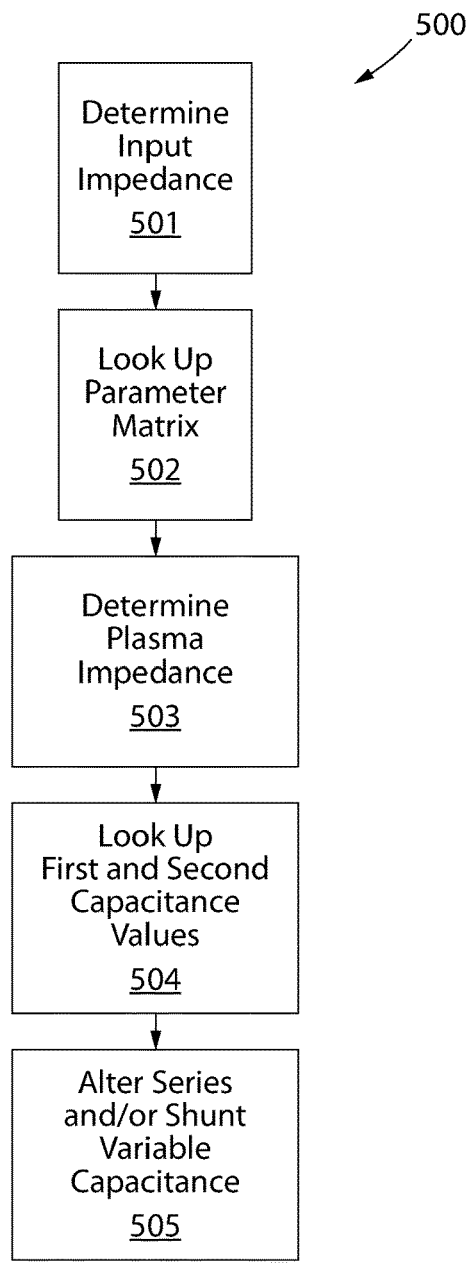
FIG. 10 is a flow chart showing an embodiment of a process for matching an impedance.

FIG. 10 is a flow chart showing a process 500 for matching an impedance according to one embodiment. Similar to the matching networks discussed above, the matching network 11 of the exemplified process includes the following (shown in FIG. 1): an RF input 13 configured to operably couple to an RF source 15, the RF source 15 having a fixed RF source impedance (e.g., 50 Ohms); an RF output 17 configured to operably couple to a plasma chamber 19, the plasma chamber 19 having a variable plasma impedance; a series electronically variable capacitor ("series EVC") 31 having a series array configuration, the series EVC 31 electrically coupled in series between the RF input 13 and the RF output 17; a shunt electronically variable capacitor ("shunt EVC") 33 having a shunt array configuration, the shunt EVC 33 electrically coupled in parallel between a ground 40 and one of the RF input 13 and the RF output 17; an RF input sensor 21 operably coupled to the RF input 13, the RF input sensor 21 configured to detect an RF input parameter at the RF input 13; an RF output sensor 49 operably coupled to the RF output 17, the RF output sensor 49 configured to detect an RF output parameter; and a control circuit 45 operatively coupled to the series EVC 31 and to the shunt EVC 33 to control the series array configuration and the shunt array configuration. The steps of the exemplified process 500 can be carried out as part of the manufacture of a semiconductor, where a substrate 27 is placed in a plasma chamber 19 configured to deposit a material layer onto the substrate 27 or etch a material layer from the substrate 27, and plasma is energized within the plasma chamber 19 by coupling RF power from the RF source 15 into the plasma chamber 19 to perform a deposition or etching.

In the exemplified process 500 of FIG. 10, the control circuit 45 is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter look-up table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter look-up table includes a plurality of parameter matrices, with each parameter matrix being associated with a particular configuration of the series EVC 31 and the shunt EVC 33. The parameter look-up table may include one or more of the aforementioned types of parameter matrices. In the exemplified process 500, the parameter look-up table includes at least a plurality of S-parameter matrices. In certain embodiments, the parameter look-up table may include at least a plurality of Z-parameter matrices. In embodiments in which the parameter look-up table includes multiple types of parameter matrices, the different types of parameter matrices are associated within the parameter look-up table in such a way so as to eliminate the need for mathematical conversions between the different types of parameter matrices. For example, the T-parameter matrix may be included as part of the parameter look-up table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter look-up table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration look-up table. These match configurations from the array configuration look-up table are the array configurations which will result in new capacitance values for the series EVC 31 and shunt EVC 33, with an impedance match being achieved with the new array configurations and associated new capacitance values. The array configuration look-up table is a table of array configurations for the series EVC 31 and the shunt EVC 33, and it includes each possible array configuration of the series EVC 31 and the shunt EVC 33 when used in combination. As an alternative to using a array configuration look-up table, the actual capacitance values for the EVCs 31, 33 may be calculated during the process—however, such real-time calculations of the capacitance values is inherently slower than looking up the match configurations in the array configuration look-up table. After the match configurations for the series EVC 31 and the shunt EVC 33 are identified in the array configuration look-up table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The look-up tables used in the process described above are compiled in advance of the RF matching network being used in conjunction with the plasma chamber 19. In creating the look-up tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter look-up table so that at least one parameter matrix of each type is associated with a respective array configuration of the EVCs 31, 33. Similarly, the load impedances are compiled into the array configuration look-up table so that each parameter matrix is associated with a respective array configuration of the EVCs 31, 33. The pre-compiled look-up tables may take into consideration the fixed RF source impedance (e.g., 50 Ohms), the power output of the RF source, and the operational frequency of the RF source, among other factors that are relevant to the operation of the RF matching network. Each look-up table may therefore have tens of thousands of entries, or more, to account for all the possible configurations of the EVCs 31, 33. The number of possible configurations is primarily determined by how many discrete capacitors make up each of the EVCs 31, 33. In compiling the look-up tables, consideration may be given to possible safety limitations, such as maximum allowed voltages and currents at critical locations inside the matching network, and this may serve to exclude entries in one or more of the look-up tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter look-up table in this manner, the entire time cost of certain calculations occurs during the testing phase for the RF matching network, and not during actual use of the RF matching network 11 with a plasma chamber 19. Moreover, because locating a value in a look-up table can take less time than calculating that same value in real time, using the look-up table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
| --- | --- | --- |
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in³ | 75 in³ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. An RF impedance matching network comprising:
   an RF input configured to be operatively coupled to an RF source, the RF source having a single fixed RF source impedance;
   an RF output configured to be operatively coupled to an RF load, the RF load comprising a plasma chamber and having a variable RF load impedance;
   an impedance matching circuit operatively coupled between the RF source and the RF output, the impedance matching circuit comprising:
      a first capacitor array comprising a first plurality of discrete capacitors and having a first array configuration which defines on and off states of the first plurality of discrete capacitors; and
      a second capacitor array comprising a second plurality of discrete capacitors and having a second array configuration which defines on and off states of the second plurality of discrete capacitors;
   an RF sensor operatively coupled to the RF input, the RF sensor configured to detect one or more RF parameters of the impedance matching circuit; and
   a control circuit operatively coupled to the first capacitor array and the second capacitor array, wherein the control circuit is configured to:
      determine an initial input impedance at the RF input of the impedance matching circuit when there is not an impedance match between the single fixed RF source impedance and the variable RF load impedance, the input impedance based on the detected one or more RF parameters;
      determine the variable RF load impedance from a parameter matrix look-up table using the determined input impedance, the first array configuration, and the second array configuration;
      after determining the variable RF load impedance, determine a first match configuration for the first capacitor array and a second match configuration for the second capacitor array to create the impedance match between the single fixed RF source impedance and the variable RF load impedance, the first match configuration and the second match configuration being determined from an array configuration look-up table using the determined variable RF load impedance; and alter at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

2. The RF impedance matching network of claim 1, wherein the parameter matrix look-up table comprises a plurality of S-parameter matrices.

3. The RF impedance matching network of claim 2, wherein the parameter matrix look-up table comprises, for each S-parameter matrix, a conversion to a Z-parameter matrix.

4. The RF impedance matching network of claim 1, wherein the parameter matrix look-up table comprises, for each combination of potential first array configurations and potential second array configurations, a parameter matrix indicative of the load impedance.

5. The RF impedance matching network of claim 1, wherein the parameter matrix look-up table comprises a plurality of Z-parameter matrices.

6. The RF impedance matching network of claim 1, wherein the RF sensor is operatively coupled to the RF input, and the detected one or more RF parameters include a voltage parameter and a current parameter.

7. A method of manufacturing a semiconductor, the method comprising:

placing a substrate in a plasma chamber configured to deposit a material layer onto the substrate or etch a material layer from the substrate; and coupling an impedance matching circuit between an RF source and the plasma chamber, the impedance matching circuit comprising:

an RF input configured to be operatively coupled to the RF source, the RF source having a single fixed RF source impedance;

an RF output configured to be operatively coupled to the plasma chamber, the plasma chamber having a variable plasma chamber impedance;

a first capacitor array comprising a first plurality of discrete capacitors and having a first array configuration which defines on and off states of the first plurality of discrete capacitors; and a second capacitor array comprising a second plurality of discrete capacitors and having a second array configuration which defines on and off states of the second plurality of discrete capacitors; and energizing plasma within the plasma chamber by coupling RF power from the RF source into the plasma chamber to perform a deposition or etching, and while energizing the plasma:

detecting one or more RF parameters of the impedance matching circuit at the RF input of the impedance matching circuit;

determining an initial input impedance at the RF input of the impedance matching circuit when there is not an impedance match between the single fixed RF source impedance and the variable RF load impedance, the input impedance based on the detected one or more RF parameters;

determining the variable plasma chamber impedance from a parameter matrix look-up table using the determined input impedance, the first array configuration, and the second array configuration;

after determining the variable plasma chamber impedance, determining a first match configuration for the first capacitor array and a second match configuration for the second capacitor array to create the impedance match between the single fixed RF source impedance and the variable plasma chamber impedance, the first match configuration and the second match configuration being determined from an array configuration look-up table using the determined variable plasma chamber impedance; and altering at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

8. The method of claim 7, wherein the parameter matrix look-up table comprises a plurality of S-parameter matrices.

9. The method of claim 8, wherein the parameter matrix look-up table comprises, for each S-parameter matrix, a conversion to a Z-parameter matrix.

10. The method of claim 7, wherein the parameter matrix look-up table comprises, for each combination of potential first array configurations and potential second array configurations, a parameter matrix indicative of the plasma chamber impedance.

11. The method of claim 7, wherein the parameter matrix look-up table comprises a plurality of Z-parameter matrices.

12. A method of impedance matching comprising:

coupling an impedance matching circuit between an RF source and an RF load, the RF source having a single fixed RF source impedance, the RF load comprising a plasma chamber and having a variable RF load impedance, and the impedance matching circuit comprising:

an RF input configured to be operatively coupled to the RF source;

an RF output configured to be operatively coupled to the RF load;

a first capacitor array comprising a first plurality of discrete capacitors and having a first array configuration which defines on and off states of the first plurality of discrete capacitors; and a second capacitor array comprising a second plurality of discrete capacitors and having a second array configuration which defines on and off states of the second plurality of discrete capacitors;

detecting one or more RF parameters of the impedance matching circuit at the RF input of the impedance matching circuit;

determining an initial input impedance at the RF input of the impedance matching circuit when there is not an impedance match between the single fixed RF source impedance and the variable RF load impedance, the input impedance based on the detected one or more RF parameters;

determining the variable RF load impedance from a parameter matrix look-up table using the determined input impedance, the first array configuration, and the second array configuration;

after determining the variable RF load impedance, determining a first match configuration for the first capacitor array and a second match configuration for the second capacitor array to create the impedance match between the single fixed RF source impedance and the variable RF load impedance, the first match configuration and the second match configuration being determined from an array configuration look-up table using the determined variable RF load impedance; and altering at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

13. The method of claim 12, wherein the parameter matrix look-up table comprises, for each combination of potential first array configurations and potential second array configurations, a parameter matrix indicative of the load impedance.

14. A semiconductor processing tool comprising:
a plasma chamber configured to deposit a material onto a substrate or etch a material from the substrate; and
an impedance matching circuit operably coupled to the plasma chamber, matching circuit comprising:
an RF input configured to be operably coupled to an RF source, the RF source having a single fixed RF source impedance;
an RF output operably coupled to the plasma chamber, the plasma chamber having a variable RF load impedance;
a first capacitor array comprising a first plurality of discrete capacitors and having a first array configuration which defines on and off states of the first plurality of discrete capacitors; and
a second capacitor array comprising a second plurality of discrete capacitors and having a second array configuration which defines on and off states of the second plurality of discrete capacitors;
an RF sensor operably coupled to the RF input, the RF sensor configured to detect one or more RF parameters of the impedance matching circuit; and
a control circuit operably coupled to the first capacitor array and the second capacitor array, wherein the control circuit is configured to:
determine an initial input impedance at the RF input of the impedance matching circuit when there is not an impedance match between the single fixed RF source impedance and the variable RF load impedance, the input impedance based on the detected one or more RF parameters;
determine the variable RF load impedance from a parameter matrix look-up table using the determined input impedance, the first array configuration, and the second array configuration;
after determining the variable RF load impedance, determine a first match configuration for the first capacitor array and a second match configuration for the second capacitor array to create the impedance match between the single fixed RF source impedance and the variable RF load impedance, the first match configuration and the second match configuration being determined from an array configuration look-up table using the determined variable RF load impedance; and
alter at least one of the first array configuration and the second array configuration to the first match configuration and the second match configuration, respectively, by controlling the on and off states of (a) each discrete capacitor of the first plurality of discrete capacitors and (b) each discrete capacitor of the second plurality of discrete capacitors.

* * * * *